United States Patent
Shimizu et al.

(10) Patent No.: US 10,497,572 B2
(45) Date of Patent: Dec. 3, 2019

(54) METHOD FOR MANUFACTURING SEMICONDUCTOR DEVICE

(71) Applicant: Kabushiki Kaisha Toshiba, Minato-ku (JP)

(72) Inventors: Tatsuo Shimizu, Shinagawa (JP); Yasutaka Nishida, Tama (JP); Toshiya Yonehara, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/105,376

(22) Filed: Aug. 20, 2018

(65) Prior Publication Data
US 2019/0259620 A1 Aug. 22, 2019

(30) Foreign Application Priority Data
Feb. 22, 2018 (JP) ................. 2018-029318

(51) Int. Cl.
| | |
|---|---|
| *H01L 21/283* | (2006.01) |
| *H01L 21/28* | (2006.01) |
| *H01L 29/423* | (2006.01) |
| *H01L 29/66* | (2006.01) |
| *H01L 29/778* | (2006.01) |
| *H01L 21/473* | (2006.01) |

(52) U.S. Cl.
CPC ...... *H01L 21/283* (2013.01); *H01L 21/28264* (2013.01); *H01L 21/473* (2013.01); *H01L 29/4236* (2013.01); *H01L 29/66431* (2013.01); *H01L 29/66462* (2013.01); *H01L 29/7786* (2013.01)

(58) Field of Classification Search
CPC ............. H01L 21/28264; H01L 21/283; H01L 21/469; H01L 21/471; H01L 21/473; H01L 29/7786; H01L 29/4236; H01L 29/66462; H01L 29/66431; H01L 29/778–7789
See application file for complete search history.

(56) References Cited

U.S. PATENT DOCUMENTS

| | | | |
|---|---|---|---|
| 2012/0223311 A1* | 9/2012 | Endo | H01L 29/7869 257/57 |
| 2018/0026107 A1 | 1/2018 | Shimizu et al. | |
| 2018/0308950 A1* | 10/2018 | Shimizu | H01L 29/402 |

FOREIGN PATENT DOCUMENTS

| | | |
|---|---|---|
| JP | 57-115823 | 7/1982 |
| JP | 2003-218352 | 7/2003 |
| JP | 2018-14456 | 1/2018 |

OTHER PUBLICATIONS

Kaneki, S., et al. "Highly-stable and low-state-density $Al_2O_3$/GaN interfaces using epitaxial n-GaN layers grown on free-standing GaN substrates", Applied Physics Letters, 109, 162104, 2016, 6 pages.

* cited by examiner

*Primary Examiner* — Joseph C. Nicely
(74) *Attorney, Agent, or Firm* — Oblon, McClelland, Maier & Neustadt, L.L.P.

(57) ABSTRACT

A method for manufacturing a semiconductor device according to an embodiment includes: forming an insulating layer having a first plane in contact with a nitride semiconductor layer and a second plane opposite to the first plane and containing at least one of an oxide and an oxynitride; and performing first heat treatment at 600° C. or more and 1100° C. or less in a state where a voltage making a first plane side positive relative to a second plane side is applied to the insulating layer.

11 Claims, 9 Drawing Sheets

Ga in SiO$_2$

H in SiO$_2$

F in SiO$_2$

N in SiO$_2$

METHOD FOR MANUFACTURING SEMICONDUCTOR DEVICE

CROSS-REFERENCE TO RELATED APPLICATION

This application is based upon and claims the benefit of priority from Japanese Patent Application No. 2018-029318, filed on Feb. 22, 2018, the entire contents of which are incorporated herein by reference.

FIELD

Embodiments described herein relate generally to a method for manufacturing a semiconductor device.

BACKGROUND

Semiconductor devices such as transistors and diodes are used in circuits such as switching power supply circuits and inverter circuits. These semiconductor devices are required to have a high breakdown voltage and a low on-resistance. There is a trade-off relationship determined by the element material in the relationship between the breakdown voltage and the on-resistance.

Due to advances in technology development, the low on-resistance has been implemented for semiconductor devices up to near the limit of silicon being the major semiconductor material. In order to further improve the breakdown voltage or further reduce the on-resistance, it is necessary to change the semiconductor material. By using a nitride semiconductor such as gallium nitride or aluminum gallium nitride as a semiconductor material of a semiconductor device, the trade-off relationship determined by the semiconductor material can be improved. Therefore, it is possible to drastically increase the breakdown voltage and reduce the on-resistance of the semiconductor devices.

However, in a transistor having a metal insulator semiconductor (MIS) structure using a nitride semiconductor, there is a problem that the threshold voltage fluctuates due to charges contained in a gate insulating layer.

DETAILED DESCRIPTION

Figure 1:
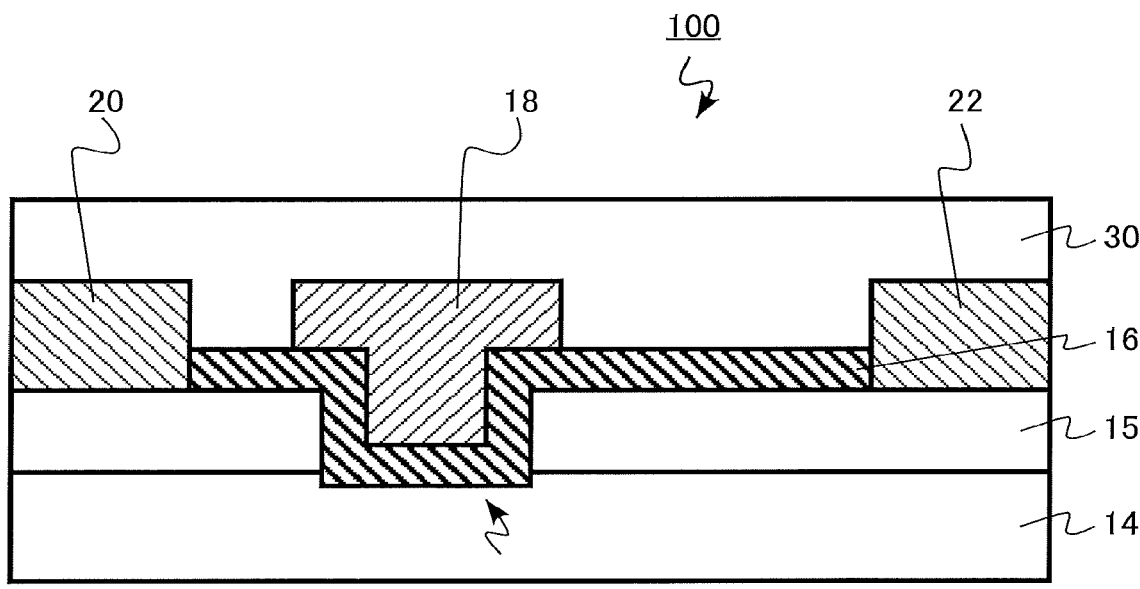
FIG. 1 is a schematic sectional view of a semiconductor device fabricated by a method for manufacturing a semiconductor device according to a first embodiment.

A method for manufacturing a semiconductor device according to an embodiment includes: forming an insulating layer having a first plane in contact with a nitride semiconductor layer and a second plane opposite to the first plane, and the insulating layer containing at least one of an oxide and an oxynitride; and performing first heat treatment at 600° C. or more and 1100° C. or less in a state where a voltage making a first plane side positive relative to a second plane side being applied to the insulating layer.

Hereinafter, embodiments of the present disclosure will be described with reference to the drawings. In the following description, the same members and the like are denoted by the same reference numerals, and the description of the members once described is omitted as appropriate.

In the present specification, a "nitride semiconductor layer" includes a "GaN-based semiconductor". A "GaN-based semiconductor" is a generic name for gallium nitride (GaN), aluminum nitride (AlN), indium nitride (InN) and semiconductors having intermediate compositions thereof.

In the present specification, "undoped" means that the impurity concentration is $1 \times 10^{15}$ cm$^{-3}$ or less.

In the present specification, in order to indicate the positional relationship of components and the like, the upward direction of the drawing is described as "above" and the downward direction of the drawing as "below". In this specification, the concepts of "above" and "below" are not necessarily terms indicating the relationship with the direction of gravity.

First Embodiment

A method for manufacturing a semiconductor device according to a first embodiment includes: forming an insulating layer having a first plane in contact with a nitride semiconductor layer and a second plane opposite to the first plane and containing at least one of an oxide and an oxynitride; and performing first heat treatment at 600° C. or more and 1100° C. or less in a state where a voltage making a first plane side positive relative to a second plane side is applied to the insulating layer. Further, before the first heat treatment is performed, a conductive layer in contact with the second plane is formed. Also, after the first heat treatment is performed, second heat treatment is performed in a state where a voltage making the first plane side negative relative to the second plane side is applied to the insulating layer.

FIG. 1 is a schematic sectional view of a semiconductor device fabricated by a method for manufacturing a semiconductor device according to the first embodiment. The semiconductor device is a high electron mobility transistor (HEMT) 100 having a MIS structure using a GaN-based semiconductor. The HEMT 100 has a gate recess structure in which a gate electrode is provided in a trench (recess).

The HEMT 100 includes a substrate 10, a buffer layer 12, a channel layer 14 (nitride semiconductor layer), a barrier layer 15 (nitride semiconductor layer), a gate insulating layer 16 (insulating layer), a gate electrode 18, a source electrode 20, a drain electrode 22, an interlayer insulating layer 30, and a trench 40.

The bottom of the trench 40 is located inside the channel layer 14. The gate insulating layer 16 and the gate electrode 18 are formed inside the trench 40. By locating the bottom of the trench 40 inside the channel layer 14, a two dimensional electron gas under the gate electrode 18 disappears. Therefore, a normally-off operation can be implemented.

The substrate 10 is formed of, for example, silicon (Si). Apart from silicon, for example sapphire ($Al_2O_3$) or silicon carbide (SiC) can also be applied.

The buffer layer 12 is provided on the substrate 10. The buffer layer 12 has a function of mitigating a lattice mismatch between the substrate 10 and the channel layer 14. The buffer layer 12 is formed as a multilayer structure of, for example, aluminum gallium nitride ($Al_WGa_{1-W}N$ ($0 \leq W \leq 1$)).

The channel layer 14 is provided on the buffer layer 12. The channel layer 14 is also called an electron transit layer. The channel layer 14 contains gallium (Ga). The channel layer 14 is, for example, undoped $Al_XGa_{1-X}N$ ($0 \leq X < 1$). More specifically, the channel layer 14 is, for example, undoped gallium nitride (GaN). The film thickness of the channel layer 14 is, for example, 0.1 µm or more and 10 µm or less.

The barrier layer 15 is provided on the channel layer 14. The barrier layer 15 is also called an electron supply layer. The band gap of the barrier layer 15 is larger than that of the channel layer 14. The barrier layer 15 contains gallium (Ga). The barrier layer 15 is, for example, undoped aluminum gallium nitride ($Al_YGa_{1-Y}N$ ($0 < Y \leq 1$, $X < Y$)). More specifically, the barrier layer 15 is, for example, undoped $Al_{0.25}Ga_{0.75}N$. The film thickness of the barrier layer 15 is, for example, 10 nm or more and 100 nm or less.

Between the channel layer 14 and the barrier layer 15 is a heterojunction interface. A two dimensional electron gas (2 DEG) is formed at the heterojunction interface and becomes a carrier of the HEMT 100.

The source electrode 20 is provided on the channel layer 14 and the barrier layer 15. The source electrode 20 is electrically connected to the channel layer 14 and the barrier layer 15.

The source electrode 20 is, for example, a metal electrode. The source electrode 20 has, for example, a stacked structure of titanium (Ti) and aluminum (Al). The source electrode 20 and the barrier layer 15 are desirably in ohmic contact.

The drain electrode 22 is provided on the channel layer 14 and the barrier layer 15. The drain electrode 22 is electrically connected to the channel layer 14 and the barrier layer 15.

The drain electrode 22 is, for example, a metal electrode. The drain electrode 22 has, for example, a stacked structure of titanium (Ti) and aluminum (Al). The drain electrode 22 and the barrier layer 15 are desirably in ohmic contact.

The distance between the source electrode 20 and the drain electrode 22 is, for example, 5 µm or more and 30 µm or less.

Note that a structure in which the source electrode 20 and the drain electrode 22 are in contact with the channel layer 14 may also be adopted.

At least a portion of the gate electrode 18 is formed inside the trench 40. The gate electrode 18 is provided on the barrier layer 15. The gate electrode 18 is provided between the source electrode 20 and the drain electrode 22.

The gate electrode 18 is, for example, polycrystalline silicon containing a conductive impurity. Also, the gate electrode 18 is, for example, a metal. The gate electrode 18 is made of, for example, titanium nitride (TiN).

At least a portion of the gate insulating layer 16 is formed inside the trench 40. The gate insulating layer 16 is located between the channel layer 14 and the gate electrode 18.

The gate insulating layer 16 has a first plane in contact with the channel layer 14 and the barrier layer 15 and a second plane opposite to the first plane. The gate electrode 18 is in contact with the second plane.

The gate insulating layer 16 is also formed on the barrier layer 15 between the gate electrode 18 and the drain electrode 22. The gate insulating layer 16 is also formed on the barrier layer 15 between the gate electrode 18 and the source electrode 20.

The gate insulating layer 16 contains at least one of an oxide and an oxynitride. The oxide is, for example, silicon oxide or aluminum oxide. The oxynitride is silicon oxynitride or aluminum oxynitride.

The thickness of the gate insulating layer 16 is, for example, 20 nm or more and 100 nm or less. The equivalent oxide thickness (EOT) of the gate insulating layer 16 is, for example, 20 nm or more and 40 nm or less.

Next, a method for manufacturing a semiconductor device according to the first embodiment will be described. FIGS. 2, 3, 4, 5, 6, 7, and 8 are schematic sectional views showing the method for manufacturing a semiconductor device according to the first embodiment.

First, the substrate 10, for example, a silicon substrate is prepared. Next, for example, a multilayer structure of aluminum gallium nitride to be the buffer layer 12 is formed by epitaxial growth on the silicon substrate. For example, the buffer layer 12 is grown by a metal organic chemical vapor deposition (MOCVD) method.

Figure 2:
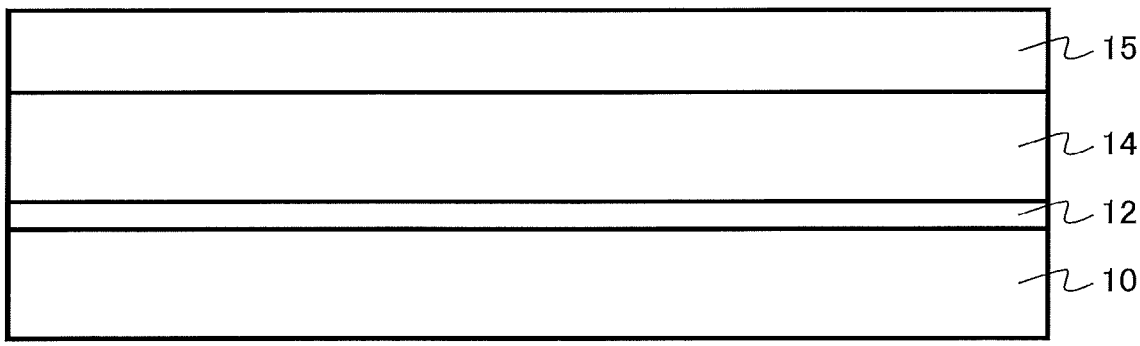
FIG. 2 is a schematic sectional view showing the method for manufacturing the semiconductor device according to the first embodiment.

Next, undoped gallium nitride to be the channel layer 14 (nitride semiconductor layer) and undoped aluminum gallium nitride to be the barrier layer 15 (nitride semiconductor layer) are formed on the buffer layer 12 by epitaxial growth (FIG. 2). The channel layer 14 and the barrier layer 15 are grown by, for example, the MOCVD method. The channel layer 14 and the barrier layer 15 contain gallium (Ga).

Figure 3:
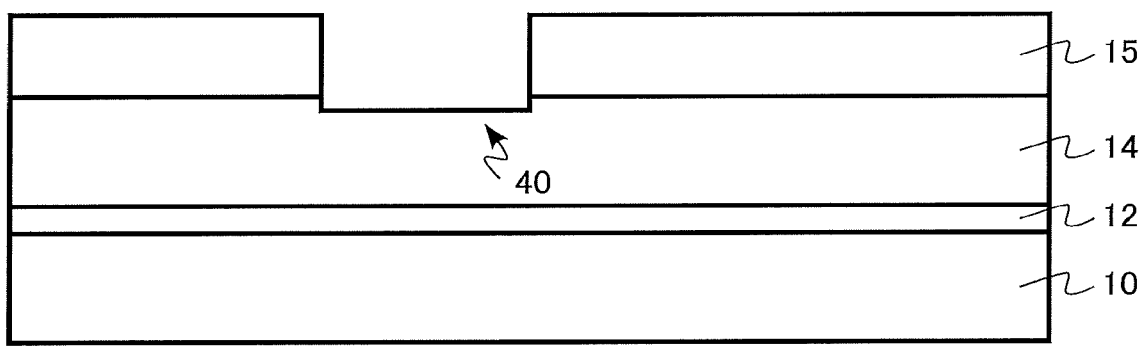
FIG. 3 is a schematic sectional view showing the method for manufacturing the semiconductor device according to the first embodiment.

Next, the trench 40 penetrating the barrier layer 15 and reaching the channel layer 14 is formed (FIG. 3). The trench 40 is formed by, for example, a reactive ion etching method. Though not shown, before forming the trench 40, for example, a silicon nitride film is formed as a mask material. The process may proceed while leaving the mask material unremoved. In this case, a stacked film of the silicon nitride film and the gate insulating film 16 is formed on the barrier layer 15. From the viewpoint of protecting the front surface of the barrier layer 15, the silicon nitride film is preferably left.

Figure 4:
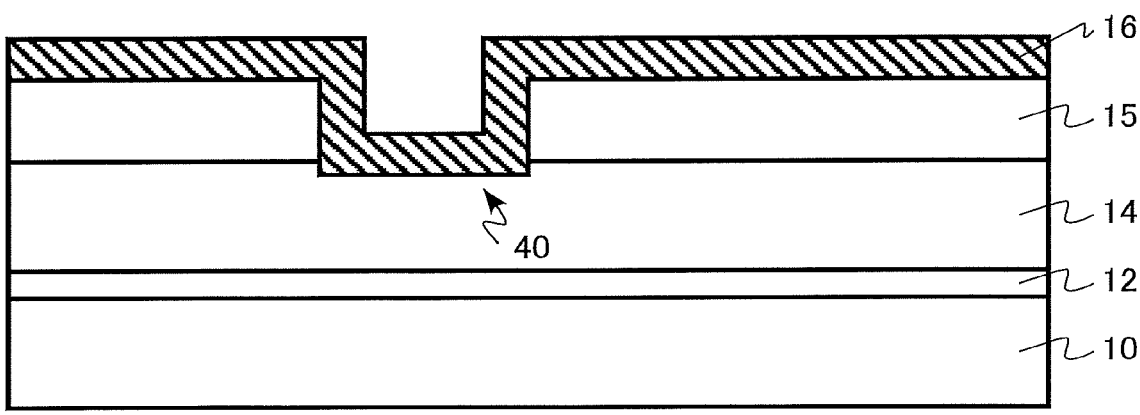
FIG. 4 is a schematic sectional view showing the method for manufacturing the semiconductor device according to the first embodiment.

Next, the gate insulating layer 16 (insulating layer) is formed on the channel layer 14 and the barrier layer 15 (FIG. 4). The gate insulating layer 16 has a first plane in contact with the channel layer 14 and the barrier layer 15 and a second plane opposite to the first plane.

The gate insulating layer 16 contains at least one of an oxide and an oxynitride. The oxide is, for example, silicon oxide or aluminum oxide. The oxynitride is, for example, silicon oxynitride or aluminum oxynitride.

The gate insulating layer 16 is formed by, for example, a chemical vapor deposition (CVD) method.

Figure 5:
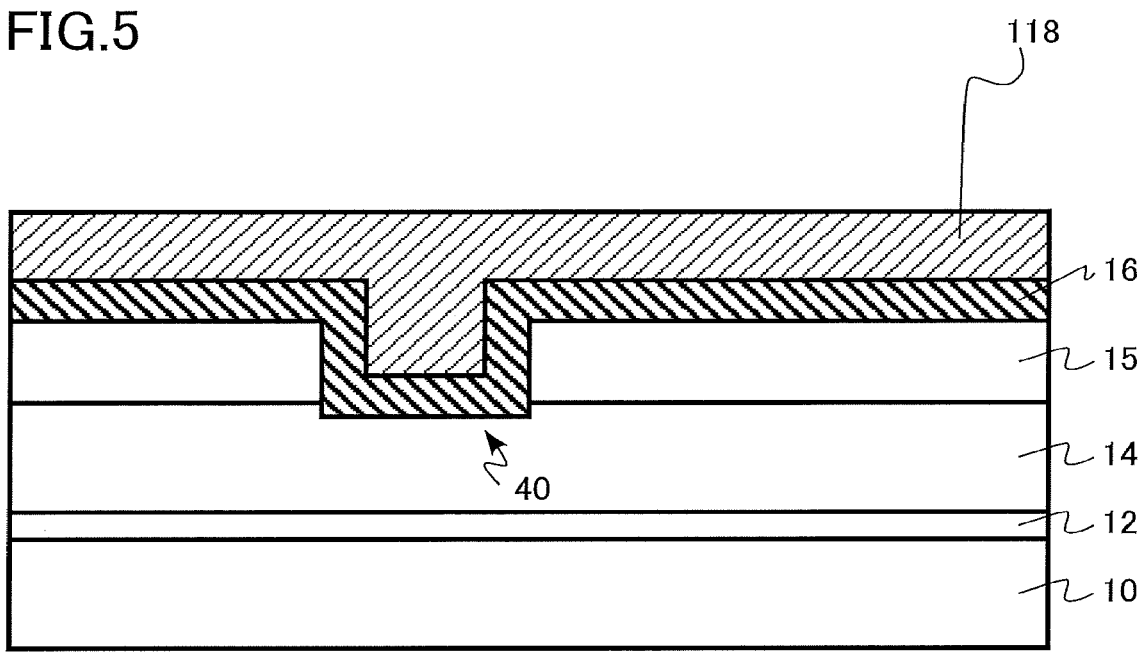
FIG. 5 is a schematic sectional view showing the method for manufacturing the semiconductor device according to the first embodiment.

Next, a conductive layer 118 in contact with the second plane of the gate insulating layer 16 is formed (FIG. 5). The conductive layer 118 is, for example, polycrystalline silicon containing a conductive impurity.

The conductive layer 118 is, for example, a metal. The conductive layer 118 is, for example, titanium nitride (TiN).

Figure 6:
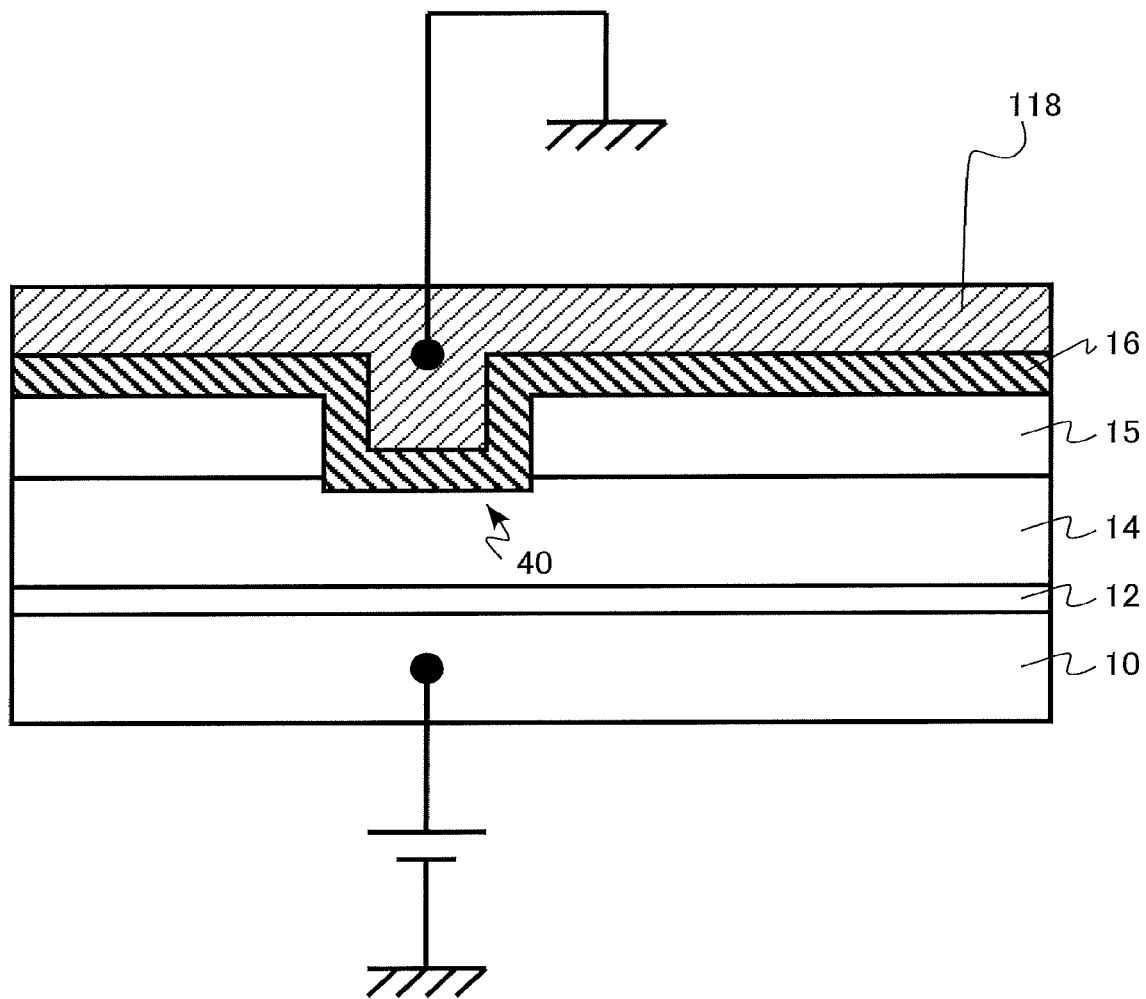
FIG. 6 is a schematic sectional view showing the method for manufacturing the semiconductor device according to the first embodiment.

Next, the first heat treatment is performed (FIG. 6). Densification of the gate insulating layer 16 is performed by the first heat treatment. Positive charges in the gate insulating layer 16 are removed by the first heat treatment. The positive charge is, for example, a hydrogen ion or a gallium ion.

The first heat treatment is performed at 600° C. or more and 1100° C. or less. The first heat treatment is performed, for example, in a non-oxidizing atmosphere. The first heat treatment is performed in an inert gas atmosphere, for example, a nitrogen atmosphere, an argon atmosphere, a helium atmosphere, or the like. The time period of the first heat treatment is, for example, 5 minutes or more and 60 minutes or less.

The first heat treatment is performed in a state where a voltage is applied to the gate insulating layer 16. A voltage making the first plane side of the gate insulating layer 16 positive relative to the second plane side is applied. For example, a voltage is applied to the gate insulating layer 16 by bringing electrodes into contact with the substrate 10 and the conductive layer 118. A voltage making the substrate 10 positive relative to the conductive layer 118 is applied.

The electric field strength in the gate insulating layer 16 during the first heat treatment is, for example, 2 MV/cm or more and 10 MV/cm or less.

Figure 7:
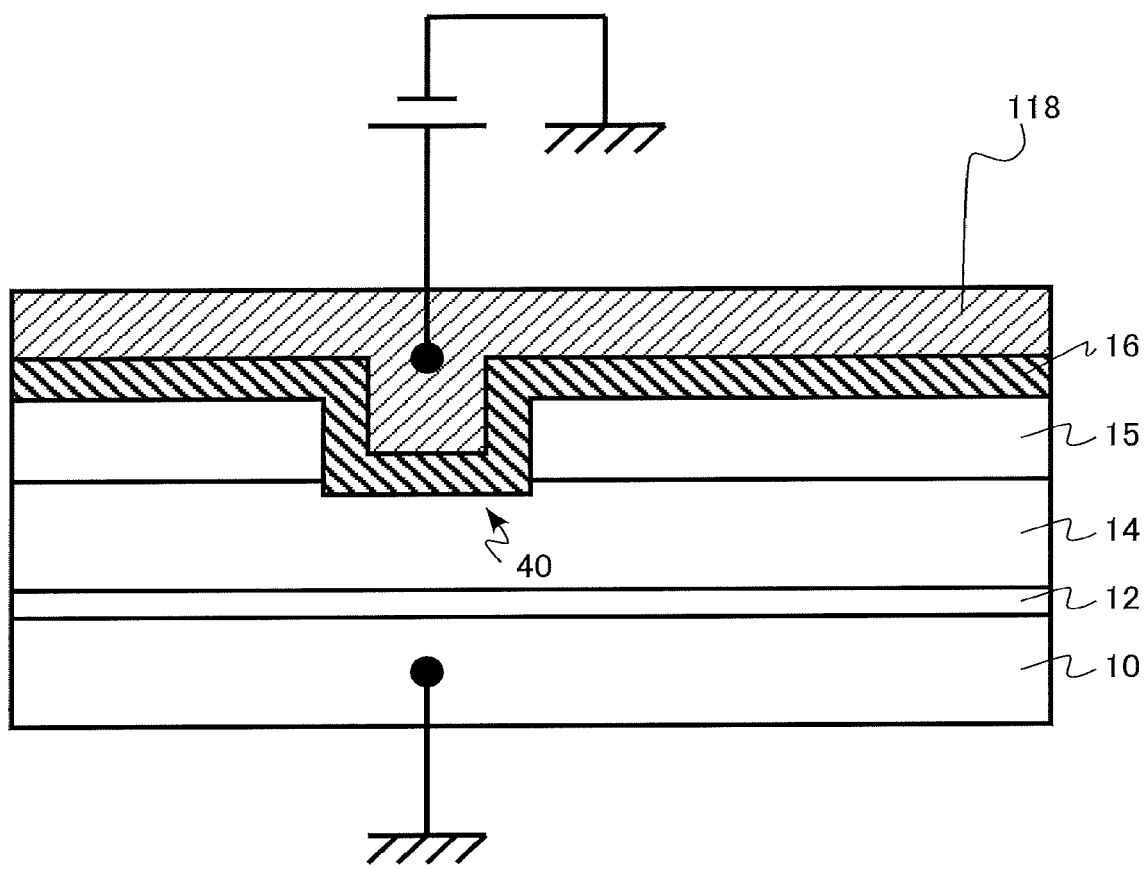
FIG. 7 is a schematic sectional view showing the method for manufacturing the semiconductor device according to the first embodiment.

Next, the second heat treatment is performed (FIG. 7). Negative charges in the gate insulating layer 16 are removed by the second heat treatment. The negative charge is, for example, a fluoride ion or a nitrogen ion.

The temperature of the second heat treatment is, for example, lower than that of the first heat treatment. The temperature of the second heat treatment is 400° C. or more and 1000° C. or less.

The second heat treatment is performed, for example, in a non-oxidizing atmosphere. The second heat treatment is performed in an inert gas atmosphere, for example, a nitrogen atmosphere, an argon atmosphere, a helium atmosphere, or the like. The time period of the second heat treatment is, for example, 5 minutes or more and 60 minutes or less.

The second heat treatment is performed in a state where a voltage is applied to the gate insulating layer 16. A voltage making the first plane side of the gate insulating layer 16 negative relative to the second plane side is applied. For example, a voltage is applied to the gate insulating layer 16 by bringing electrodes into contact with the substrate 10 and the conductive layer 118. A voltage making the substrate 10 negative relative to the conductive layer 118 is applied.

The electric field strength in the gate insulating layer 16 during the second heat treatment is, for example, 2 MV/cm or more and 10 MV/cm or less.

Figure 8:
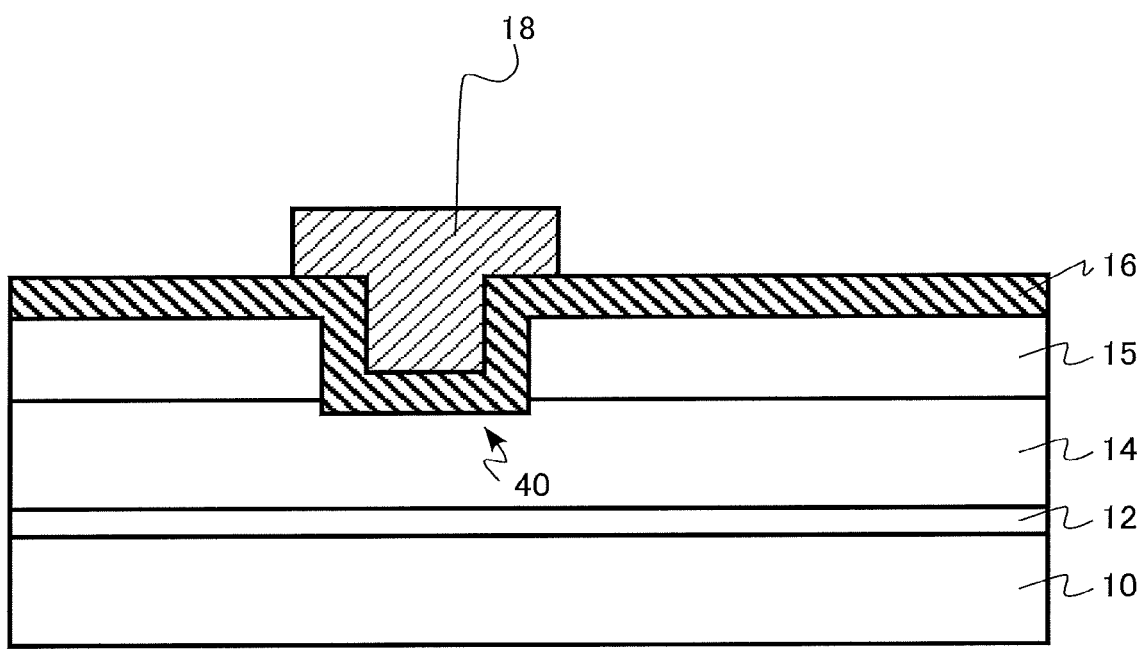
FIG. 8 is a schematic sectional view showing the method for manufacturing the semiconductor device according to the first embodiment.

Next, the conductive layer 118 is patterned to form the gate electrode 18 (FIG. 8). The patterning of the conductive layer 118 is performed using, for example, a lithography method and a reactive ion etching method.

Next, the source electrode 20, the drain electrode 22, and the interlayer insulating layer 30 are formed by a known method.

By the above manufacturing method, the HEMT 100 shown in FIG. 1 is formed.

Hereinafter, the function and effect of the method for manufacturing a semiconductor device according to the first embodiment will be described. Hereinafter, a case where the gate insulating layer 16 is silicon oxide is taken as an example.

In a transistor having a MIS structure using a nitride semiconductor, there is a problem that a threshold voltage fluctuates due to charges contained in the gate insulating layer. According to the first embodiment, by performing heat treatment by applying a voltage to the gate insulating layer, the amount of charge contained in the gate insulating layer is reduced. Therefore, a transistor having the MIS structure capable of suppressing fluctuations of the threshold voltage is implemented. Details will be described below.

The threshold voltage of a transistor is considered to fluctuate because charges contained in the gate insulating layer move due to a gate voltage applied to the gate electrode during operation of the transistor. Alternatively, fluctuations of the threshold voltage of a transistor is considered to be caused by movement of charges contained in the gate insulating layer due to thermal diffusion. Therefore, in order to suppress fluctuations of the threshold voltage, the amount of charges contained in the gate insulating layer is desired to be reduced.

Charges contained in the gate insulating layer are, for example, ionized gallium (Ga), nitrogen (N), hydrogen (H), or fluorine (F). Gallium (Ga) and nitrogen (N) originate, for example, from the nitride semiconductor layer below the gate insulating layer. Hydrogen (H) originates, for example, from the source gas at the time of forming the gate insulating layer. Fluorine (F) originates, for example, from members of the reaction chamber of the process equipment.

Gallium (Ga) and nitrogen (N) are considered to be contained in the gate insulating layer by being diffused from the nitride semiconductor layer during the heat treatment after the formation of the gate insulating layer. From the viewpoint of improving the film quality of the gate insulating layer, it is preferable to perform densification at a relatively high temperature. However, when densification is performed at a high temperature, gallium (Ga) and nitrogen (N) are separated from the nitride semiconductor layer and diffuse into the gate insulating layer, so that fluctuations of the threshold voltage are more likely to occur.

Figure 9A:
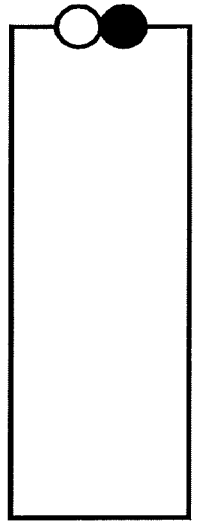
FIGS. 9A, 9B, 9C, and 9D are explanatory views of functions and effects of the first embodiment.
Figure 9B:
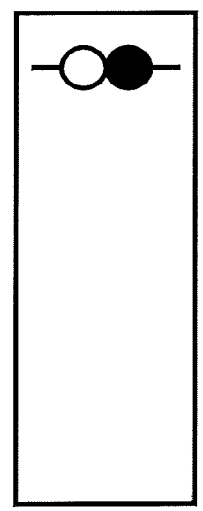
Figure 9C:
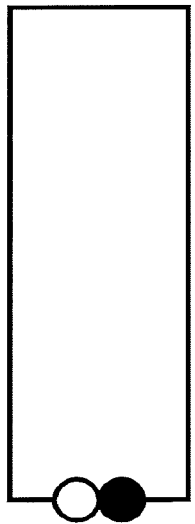
Figure 9D:

FIGS. 9A, 9B, 9C, and 9D are explanatory diagrams of functions and effects of the method for manufacturing a semiconductor device according to the first embodiment. FIG. 9A is a diagram showing the energy level of gallium (Ga) in the band gap of silicon oxide. FIG. 9B is a diagram showing the energy level of hydrogen (H) in the band gap of silicon oxide. FIG. 9C is a diagram showing the energy level of fluorine (F) in the band gap of silicon oxide. FIG. 9D is a diagram showing the energy level of nitrogen (N) in the band gap of silicon oxide. FIGS. 9A, 9B, 9C, and 9D are based on results of a first principle calculation by the inventors.

As shown in FIG. 9A, gallium (Ga) in silicon oxide forms an energy level near the lower end of the conduction band of silicon oxide. Gallium (Ga) emits electrons to become a positive ion. In addition, gallium (Ga) becomes energy-stable by being positioned between lattices of silicon oxide. Therefore, diffusion of gallium (Ga) in silicon oxide is relatively fast.

As shown in FIG. 9B, hydrogen (H) in silicon oxide forms an energy level near the lower end of the conduction band of silicon oxide. Hydrogen (H) emits an electron to become a positive ion. In addition, hydrogen (H) becomes energy-stable by being positioned between lattices of silicon oxide. Therefore, diffusion of hydrogen (H) in silicon oxide is relatively fast.

As shown in FIG. 9C, fluorine (F) in silicon oxide forms an energy level near the upper end of the valence band of silicon oxide. Fluorine (F) becomes a negative ion by receiving an electron. In addition, fluorine (F) becomes energy-stable by being positioned between lattices of silicon oxide. Compared with, for example, hydrogen (H) positioned between lattices to become a positive ion, the diffusion of fluorine (F) in silicon oxide is slow. This is because fluorine (F) in silicon oxide is a negative ion and so has a large electron cloud.

As shown in FIG. 9D, nitrogen (N) in silicon oxide forms an energy level near the upper end of the valence band of silicon oxide. Nitrogen (N) becomes a negative ion by receiving an electron. In addition, nitrogen (N) becomes energy-stable by being positioned at the lattice point of silicon oxide. For this reason, the diffusion of nitrogen (N) in silicon oxide is relatively slow.

As described above, gallium (Ga) and nitrogen (N) originate from the nitride semiconductor layer. As a result of the first principle calculation by the inventors, it turned out that the energy of formation of gallium holes in gallium nitride is much higher than that of nitrogen holes in gallium nitride. The energy of formation of a gallium hole in gallium nitride is 8.4 eV and that of a nitrogen hole in gallium nitride is 3.2 eV.

Therefore, it is considered difficult for gallium to be simply separated from gallium nitride to form a gallium hole. Three electrons are short in a gallium hole. Thus, when three nitrogen holes are formed and dangling bonds of gallium are formed, a gallium hole is considered to be stabilized. That is, gallium holes are more likely to be formed by nitrogen holes being formed.

Therefore, if the formation of nitrogen holes is suppressed, gallium holes are less likely to be formed. In other words, if separation of nitrogen (N) from the nitride semiconductor layer is suppressed, separation of gallium (Ga) from the nitride semiconductor layer is suppressed.

In the method for manufacturing a semiconductor device according to the first embodiment, after the formation of the gate insulating layer 16, the first heat treatment is performed in a state where a voltage is applied to the gate insulating layer 16. A voltage making the first plane side of the gate insulating layer 16 positive relative to the second plane side is applied. Thus, the movement of nitrogen (N) that becomes a negative ion in silicon oxide in the direction from the first plane of the gate insulating layer 16 toward the second plane is suppressed. Therefore, the separation of nitrogen (N) from the nitride semiconductor layer is suppressed. Consequently, the separation of gallium (Ga) from the nitride semiconductor layer is also suppressed.

Since the separation of nitrogen (N) and gallium (Ga) from the nitride semiconductor layer during the first heat treatment is suppressed, threshold voltage fluctuations of the HEMT 100 can be suppressed even if the first heat treatment is performed at a high temperature. Therefore, densification of the gate insulating layer 16 can be performed at a high temperature.

Also, in the first heat treatment, it becomes easier for an element that becomes a positive ion in silicon oxide, for example, hydrogen (H) to move in the direction from the first plane of the gate insulating layer 16 toward the second plane. Thus, positive ions inside the silicon oxide are removed from the inside of the gate insulating layer 16. Therefore, threshold voltage fluctuations of the HEMT 100 can be suppressed.

The temperature of the first heat treatment is 600° C. or more and 1100° C. or less and preferably 800° C. or more and 1050° C. or less. Below the above range, there is a possibility that the densifying effect of the gate insulating layer 16 is not sufficiently obtained. In addition, if the above range is exceeded, there is a possibility that nitrogen (N) is separated from the nitride semiconductor layer.

The temperature of the first heat treatment is preferably determined in consideration of the heat resistance of the gate insulating layer 16 and the gate electrode 18. For example, when the gate insulating layer 16 is aluminum oxide, from the viewpoint of suppressing the crystallization of aluminum oxide, the temperature of the first heat treatment is preferably less than 800° C. Further, when the gate electrode 18 is, for example, titanium nitride, the temperature of the first heat treatment is preferably 700° C. or less.

From the viewpoint of suppressing oxidation of the gate electrode 18 and the nitride semiconductor layer, the first heat treatment is preferably performed in a non-oxidizing atmosphere. That is, the first heat treatment is preferably performed in an atmosphere that does not allow to intentionally contain oxygen. For example, the first heat treatment is performed in an inert gas atmosphere such as a nitrogen atmosphere, an argon atmosphere, or a helium atmosphere.

The time period of the first heat treatment is preferably five minutes or more and 60 minutes or less. Below the above range, there is a possibility that the densifying effect of the gate insulating layer 16 is not sufficiently obtained. In addition, if the above range is exceeded, the fabrication time of the HEMT 100 may become longer and the fabrication cost may increase.

The electric field strength in the gate insulating layer 16 during the first heat treatment is preferably 2 MV/cm or more and 10 MV/cm or less, and more preferably 4 MV/cm or more and 8 MV/cm or less. Below the above range, there is a possibility that the effect of suppressing the separation of nitrogen (N) from the nitride semiconductor layer and the effect of removing positive ions from the inside of the gate insulating layer 16 are not sufficiently obtained. If the above range is exceeded, the reliability of the gate insulating layer 16 may decrease.

In the method for manufacturing a semiconductor device according to the first embodiment, the second heat treatment is further performed after the first heat treatment. The second heat treatment is performed in a state where a voltage is applied to the gate insulating layer 16. A voltage making the first plane side of the gate insulating layer 16 negative relative to the second plane side is applied.

In the second heat treatment, it becomes easier for an element that becomes a negative ion in silicon oxide, for example, fluorine (F) and nitrogen (N) to move in the direction from the first plane of the gate insulating layer 16 toward the second plane. Thus, negative ions inside the silicon oxide are removed from the inside of the gate insulating layer 16. Therefore, threshold voltage fluctuations of the HEMT 100 can be suppressed.

At the time of performing the second heat treatment, the gate insulating layer 16 has been densified by the first heat treatment. Thus, it is difficult for nitrogen (N) separated from the nitride semiconductor layer to enter the lattice point of oxygen in the gate insulating layer 16. Therefore, even if nitrogen (N) is removed from the inside of the gate insulating layer 16, the separation of nitrogen (N) from the nitride semiconductor layer hardly occurs.

The temperature of the second heat treatment is preferably lower than that of the first heat treatment from the viewpoint of suppressing the separation of nitrogen (N) from the nitride semiconductor layer. The temperature of the second heat treatment is preferably 400° C. or more and 1000° C. or less. Below the above range, there is a possibility that the effect of removing negative ions in the gate insulating layer 16 is not sufficiently obtained. In addition, if the above range is exceeded, there is a possibility that nitrogen (N) is separated from the nitride semiconductor layer.

From the viewpoint of suppressing oxidation of the gate electrode 18 and the nitride semiconductor layer, the second heat treatment is preferably performed in a non-oxidizing atmosphere. For example, the second heat treatment is preferably performed in an inert gas atmosphere such as a nitrogen atmosphere, an argon atmosphere, or a helium atmosphere.

The time period of the second heat treatment is preferably five minutes or more and 60 minutes or less. Below the above range, there is a possibility that the effect of removing negative ions in the gate insulating layer 16 is not sufficiently obtained. If the above range is exceeded, the fabrication time of the HEMT 100 may become longer and the fabrication cost may increase.

The electric field strength in the gate insulating layer 16 during the second heat treatment is preferably 2 MV/cm or more and 10 MV/cm or less, and more preferably 4 MV/cm or more and 8 MV/cm or less. Below the above range, there is a possibility that the effect of removing negative ions from the inside of the gate insulating layer 16 is not sufficiently obtained. If the above range is exceeded, the reliability of the gate insulating layer 16 may decrease.

According to the fabrication method in the first embodiment, as described above, the amount of charges contained in the gate insulating layer 16 can be reduced. Therefore, a transistor having the MIS structure capable of suppressing fluctuations of the threshold voltage is implemented.

Second Embodiment

A method for manufacturing a semiconductor device according to a second embodiment is different from that in the first embodiment in that the first heat treatment is performed before a conductive layer in contact with the second plane is formed. Hereinafter, the description of content overlapping with that in the first embodiment will be partially omitted.

Figure 10:
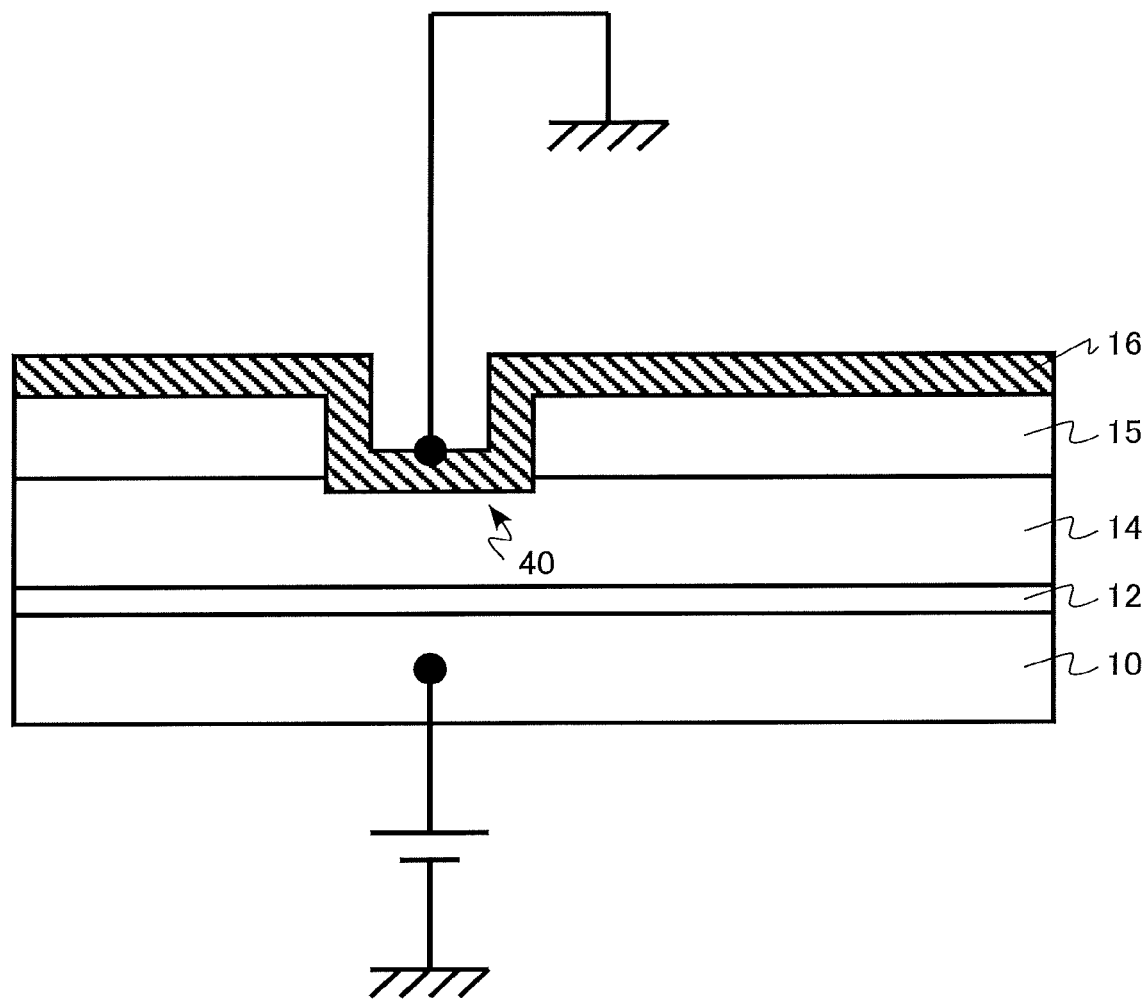
FIG. 10 is a schematic sectional view showing a method for manufacturing a semiconductor device according to a second embodiment.
Figure 11:
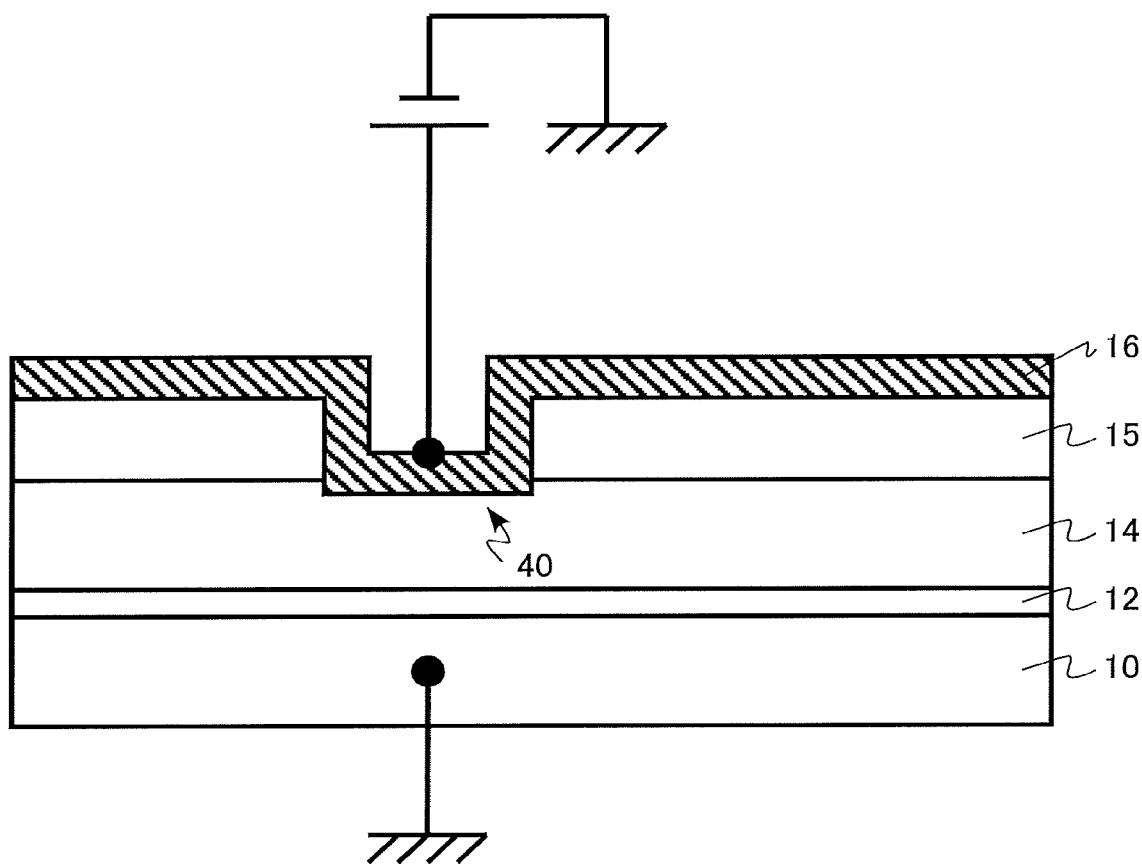
FIG. 11 is a schematic sectional view showing the method for manufacturing the semiconductor device according to the second embodiment.

FIGS. 10 and 11 are schematic sectional views showing a method for manufacturing the semiconductor device according to the second embodiment.

As in the first embodiment, the gate insulating layer 16 (insulating layer) is formed on the channel layer 14 and the barrier layer 15. The gate insulating layer 16 has the first plane in contact with the channel layer 14 (nitride semiconductor layer) and the barrier layer 15 (nitride semiconductor layer) and the second plane opposite to the first plane.

Next, the first heat treatment is performed (FIG. 10). Densification of the gate insulating layer 16 is performed by the first heat treatment. Positive charges in the gate insulating layer 16 are removed by the first heat treatment. The positive charge is, for example, a hydrogen ion or a gallium ion.

The first heat treatment is performed at 600° C. or more and 1100° C. or less. The first heat treatment is performed, for example, in a non-oxidizing atmosphere. The first heat treatment is performed in an inert gas atmosphere, for example, a nitrogen atmosphere, an argon atmosphere, a helium atmosphere, or the like. The time period of the first heat treatment is, for example, five minutes or more and 60 minutes or less.

The first heat treatment is performed in a state where a voltage is applied to the gate insulating layer 16. A voltage making the first plane side of the gate insulating layer 16 positive relative to the second plane side is applied. For example, a voltage is applied to the gate insulating layer 16 by bringing electrodes into contact with the substrate 10 and the gate insulating layer 16.

The electric field strength in the gate insulating layer 16 during the first heat treatment is, for example, 2 MV/cm or more and 10 MV/cm or less.

Next, the second heat treatment is performed (FIG. 11). Negative charges in the gate insulating layer 16 are removed by the second heat treatment. The negative charge is, for example, a fluoride ion or a nitrogen ion.

The temperature of the second heat treatment is, for example, lower than that of the first heat treatment. The temperature of the second heat treatment is 400° C. or more and 1000° C. or less.

The second heat treatment is performed, for example, in a non-oxidizing atmosphere. The second heat treatment is performed in an inert gas atmosphere, for example, a nitrogen atmosphere, an argon atmosphere, a helium atmosphere, or the like. The time period of the second heat treatment is, for example, five minutes or more to 60 minutes or less.

The second heat treatment is performed in a state where a voltage is applied to the gate insulating layer 16. A voltage making the first plane side of the gate insulating layer 16 negative relative to the second plane side is applied. For example, a voltage is applied to the gate insulating layer 16 by bringing electrodes into contact with the substrate 10 and the gate insulating layer 16.

The electric field strength in the gate insulating layer 16 during the second heat treatment is, for example, 2 MV/cm or more and 10 MV/cm or less.

Next, the conductive layer 118 in contact with the second plane of the gate insulating layer 16 is formed. The conductive layer 118 is, for example, polycrystalline silicon containing a conductive impurity. Also, the conductive layer 118, for example, a metal. The conductive layer 118 is, for example, titanium nitride (TiN).

Next, the conductive layer 118 is patterned to form the gate electrode 18. The patterning of the conductive layer 118 is performed using, for example, a lithography method and a dry etching method.

Next, the source electrode 20, the drain electrode 22, and the interlayer insulating layer 30 are formed by a known method.

According to the fabrication method in the second embodiment, as described above, as in the first embodiment, the amount of charges contained in the gate insulating layer 16 can be reduced. Therefore, a transistor having the MIS structure capable of suppressing fluctuations of the threshold voltage is implemented. Further, before a conductive layer in contact with the second plane is formed, the first heat treatment is performed. Therefore, process conditions, particularly the temperature, of the first heat treatment and the second heat treatment are not limited by the material of the conductive layer.

In the first and second embodiments, gallium nitride or aluminum gallium nitride containing gallium (Ga) is taken as an example of the nitride semiconductor, but, for example, indium gallium nitride or indium aluminum gallium nitride containing indium (In) can also be applied. It is also possible to apply aluminum nitride, indium nitride, or indium aluminum nitride not containing Ga. Stacked structures of these nitride semiconductors can also be applied.

Also in the first and second embodiments, undoped aluminum gallium nitride is taken as an example of the barrier layer 15, but n-type aluminum gallium nitride can also be applied.

Also in the first and second embodiments, the case where the bottom of the trench 40 is located in the channel layer 14 is taken as an example, but a structure in which the bottom of the trench 40 is located in the barrier layer 15 can also be adopted. Further, a structure in which aluminum gallium nitride, aluminum nitride, or the like is re-grown on the bottom of the trench can be adopted.

Also in the first and second embodiments, the HEMT having the gate recess structure is taken as an example, but the present disclosure can also be applied to a HEMT having a planar gate structure without the gate recess structure.

Also in the first and second embodiments, the HEMT using a two dimensional electron gas as a carrier is taken as an example, but the present disclosure can also be applied to an ordinary metal oxide semiconductor field effect transistor (MOSFET) not using a two dimensional electron gas.

Also in the first and second embodiments, the case where the gate insulating layer 16 is made of silicon oxide has been mainly described, but the present disclosure is not limited to the case where the gate insulating layer 16 is made of silicon oxide and the present disclosure can also be applied when at least one of oxides and oxynitrides such as aluminum oxide, silicon oxynitride, and aluminum oxynitride is contained. The gate insulating film 16 may contain, for example, a nitride. For example, the nitride is silicon nitride or aluminum nitride. In addition, different stacked films may be applied to a portion of the gate insulating film 16 in contact with the channel layer 14 and a portion of the gate insulating film 16 in contact with the barrier layer 15.

Also in the first and second embodiments, as an example of the method of applying a voltage to the insulating layer, the case of bringing electrodes into contact has been described, but the method of applying a voltage to the insulating layer is not limited to the above method. For example, in the second embodiment, it is also possible to apply a voltage to the gate insulating layer 16 by generating plasma in the space above the gate insulating layer 16 and inducing a positive charge or a negative charge.

While certain embodiments have been described, these embodiments have been presented by way of example only, and are not intended to limit the scope of the inventions. Indeed, a method for manufacturing a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:
    forming an insulating layer having a first plane in contact with a nitride semiconductor layer and a second plane opposite to the first plane, and the insulating layer containing at least one of an oxide and an oxynitride; and
    performing first heat treatment at 600° C. or more and 1100° C. or less in a state where a voltage making a first plane side positive relative to a second plane side being applied to the insulating layer.

2. The method according to claim 1, further comprising: forming a conductive layer in contact with the second plane before the performing the first heat treatment.

3. The method according to claim 1, wherein the oxide is silicon oxide or aluminum oxide, and the oxynitride is silicon oxynitride or aluminum oxynitride.

4. The method according to claim 1, wherein the first heat treatment is performed in a non-oxidizing atmosphere.

5. The method according to claim 1, wherein an electric field strength in the insulating layer at a time of the performing the first heat treatment is 2 MV/cm or more and 10 MV/cm or less.

6. The method according to claim 1, wherein a temperature of the first heat treatment is 800° C. or more.

7. The method according to claim 1, wherein a time period of the first heat treatment is 5 minutes or more and 60 minutes or less.

8. The method according to claim 1, wherein the nitride semiconductor layer contains gallium.

9. The method according to claim 1, further comprising: performing second heat treatment after the first heat treatment, the second heat treatment being performed in a state where a voltage making the first plane side negative relative to the second plane side being applied to the insulating layer.

10. The method according to claim 9, wherein a temperature of the second heat treatment is lower than a temperature of the first heat treatment.

11. The method according to claim 9, wherein a temperature of the second heat treatment is 400° C. or more and 1000° C. or less.

* * * * *